(12) United States Patent
Abe

(10) Patent No.: US 8,872,302 B2
(45) Date of Patent: Oct. 28, 2014

(54) ELECTRONIC APPARATUS

(75) Inventor: Masayuki Abe, Hadano (JP)

(73) Assignees: Eyeviewtech Co., Ltd., Seongnam-Si (KR); 3D-Bio Co., Ltd., Tokyo (JP)

(*) Notice: Subject to any disclaimer, the term of this patent is extended or adjusted under 35 U.S.C. 154(b) by 247 days.

(21) Appl. No.: 13/389,776

(22) PCT Filed: Aug. 5, 2010

(86) PCT No.: PCT/KR2010/005150
§ 371 (c)(1),
(2), (4) Date: Feb. 9, 2012

(87) PCT Pub. No.: WO2011/019163
PCT Pub. Date: Feb. 17, 2011

(65) Prior Publication Data
US 2012/0139074 A1      Jun. 7, 2012

(30) Foreign Application Priority Data

Aug. 11, 2009   (JP) ................. 2009-186884

(51) Int. Cl.
| | | |
|---|---|---|
| H01L 27/148 | (2006.01) | |
| H01L 27/16 | (2006.01) | |
| G01J 5/20 | (2006.01) | |
| H01L 31/105 | (2006.01) | |

(52) U.S. Cl.
CPC .............. *H01L 27/16* (2013.01); *H01L 31/105* (2013.01)
USPC .............. 257/470; 257/467; 257/E27.008; 257/E27.136; 438/54; 438/74; 250/338.4; 136/225

(58) Field of Classification Search
CPC ............. G01J 5/08; G01J 5/0853; G01J 5/12; G01J 5/20; G01J 5/28; H01L 27/14649; H01L 27/14669; H01L 27/1467; H01L 27/16; H01L 35/32
USPC .................... 257/21, 431, 458, 461, 470, 467, 257/E31.131, E31.073, E27.141, E25.008, 257/27.008, E27.136; 438/54, 74; 250/338.4; 136/225

See application file for complete search history.

(56) References Cited

U.S. PATENT DOCUMENTS

| | | | |
|---|---|---|---|
| 4,710,588 A | 12/1987 | Ellion | ............... 136/206 |
| 6,335,478 B1 * | 1/2002 | Chou et al. | ............... 136/201 |

(Continued)

FOREIGN PATENT DOCUMENTS

| | | |
|---|---|---|
| EP | 1 246 251 A2 | 10/2002 |
| JP | 2000244023 A * | 9/2000 |

(Continued)

OTHER PUBLICATIONS

Office Action issued by the Japanese Intellectual Property Office on Feb. 23, 2010.

(Continued)

*Primary Examiner* — Cheung Lee
*Assistant Examiner* — Jeremy Joy
(74) *Attorney, Agent, or Firm* — Stein IP, LLC

(57) ABSTRACT

Disclosed is an electronic apparatus in which a thermoelectric conversion element and at least one of a photoelectric conversion element and a transistor or a diode are monolithically integrated, or which prevents interference between a p-type thermoelectric conversion unit and an n-type thermoelectric conversion unit. This electronic apparatus includes a thermoelectric conversion element (100) including a semiconductor layer of stacked heterostructure (38) which performs thermoelectric conversion using Seebeck effect and at least one of a photoelectric conversion element (102) in which at least a portion of the semiconductor layer of stacked heterostructure (38) performs photoelectric conversion and a transistor (104) or a diode having at least a portion of the semiconductor layer of stacked heterostructure (38) as an operating layer.

13 Claims, 10 Drawing Sheets

(56) References Cited

U.S. PATENT DOCUMENTS

| | | | |
|---|---|---|---|
| 6,483,111 B1 * | 11/2002 | Ishikawa et al. | 250/338.4 |
| 6,541,298 B2 * | 4/2003 | Iida et al. | 438/54 |
| 6,806,470 B2 * | 10/2004 | Iida et al. | 250/338.1 |
| 8,426,864 B2 * | 4/2013 | Tsuji et al. | 257/66 |
| 2001/0025926 A1 * | 10/2001 | Mashio et al. | 250/338.4 |

FOREIGN PATENT DOCUMENTS

| | | |
|---|---|---|
| JP | 2000-311974 | 11/2000 |
| JP | 2004-146778 | 5/2004 |
| JP | 2005-217629 | 8/2005 |
| JP | 2005217629 A * | 8/2005 |
| JP | 2005-297454 | 10/2005 |
| KR | 10-1996-0008579 | 6/1996 |
| KR | 10-2006-0088082 | 8/2006 |
| WO | WO 2010151012 A3 * | 4/2011 |

OTHER PUBLICATIONS

Russian Office Action for the corresponding Chinese application, RU 2012108191, dated Aug. 16, 2013.

Chinese Office Action for the corresponding Chinese application, CN 201080035934.9, dated Feb. 28, 2014.

* cited by examiner

ELECTRONIC APPARATUS

CROSS-REFERENCE TO RELATED APPLICATIONS

This application is a national phase International Patent Application No. PCT/KR2010/005150, filed Aug. 5, 2010, which claims the benefit of Japanese Patent Application No. 2009-186884, filed Aug. 11, 2009, in the Japanese Patent Office. All disclosures of which are incorporated herein by reference.

BACKGROUND OF THE INVENTION

1. Field of the Invention

The present invention relates to an electronic apparatus and a thermal conversion apparatus, and, more particularly, to an electronic apparatus and a thermal conversion apparatus, having a thermoelectric conversion element.

2. Description of the Related Art

A thermoelectric conversion element is used to convert thermal Japanese Unexamined Patent Publication No. 2000-244023 discloses a thermoelectric conversion apparatus using Seebeck effect of a semiconductor energy into electric energy using Seebeck effect.

SUMMARY OF THE INVENTION

There is a need for an electronic apparatus wherein a thermoelectric conversion element and at least one of a photoelectric conversion element and a transistor or a diode are integrated. However, because monolithic integration of the thermoelectric conversion element and at least one of the photoelectric conversion element and the transistor or the diode is difficult, hybrid integration thereof has been carried out to date.

In the case where a thermoelectric conversion apparatus includes a p-type thermoelectric conversion unit including a p-type semiconductor layer responsible for thermoelectric conversion and an n-type thermoelectric conversion unit including an n-type semiconductor layer responsible for thermoelectric conversion, the p-type thermoelectric conversion unit may interfere with the n-type thermoelectric conversion unit.

Accordingly, the present invention has been made keeping in mind the above problems, and an object of the present invention is to provide an electronic apparatus, which enables the monolithic integration of a thermoelectric conversion element and at least one of a photoelectric conversion element and a transistor or a diode or which prevents the interference between a p-type thermoelectric conversion unit and an n-type thermoelectric conversion unit.

The present invention provides an electronic apparatus, comprising a thermoelectric conversion element including a semiconductor layer which performs thermoelectric conversion, and at least one of a photoelectric conversion element in which at least a portion of the semiconductor layer performs photoelectric conversion and a transistor or a diode having at least a portion of the semiconductor layer as an operating layer. According to the present invention, the thermoelectric conversion element and at least one of the photoelectric conversion element and the transistor or the diode may be monolithically integrated.

The present invention provides an electronic apparatus, comprising a thermoelectric conversion element including a semiconductor layer of stacked heterostructure 38 which performs thermoelectric conversion using Seebeck effect, and at least one of a photoelectric conversion element in which at least a portion of the said semiconductor layer performs photoelectric conversion and a transistor or a diode having at least a portion of the said semiconductor layer as an operating layer, wherein the said semiconductor layer has bandgap energy corresponding to UV (UltraViolet) light, the thermoelectric conversion element has an IR (InfraRed) absorption part which absorbs IR rays and converts them into heat, and at least the portion of the semiconductor layer of the photoelectric conversion element performs photoelectric conversion of UV light. According to this construction, the photoelectric conversion element which detects UV light and the thermoelectric conversion element which detects IR rays may be monolithically integrated.

The present invention provides an electronic apparatus, comprising a thermoelectric conversion element including a said semiconductor layer which performs thermoelectric conversion using Seebeck effect, and at least one of a photoelectric conversion element in which at least a portion of the said semiconductor layer performs photoelectric conversion and a transistor or a diode having at least a portion of the said semiconductor layer as an operating layer, wherein the said semiconductor layer has bandgap energy corresponding to IR rays, the thermoelectric conversion element has an IR absorption part which absorbs IR rays and converts them into heat, and at least the portion of the semiconductor layer of the photoelectric conversion element performs photoelectric conversion of IR rays. According to this construction, the thermoelectric conversion element which detects wide-range IR rays and the photoelectric conversion element which detects IR rays corresponding to the bandgap energy of the said semiconductor layer may be monolithically integrated.

In the above construction, the said semiconductor layer may include a p-type semiconductor layer and an n-type semiconductor layer which are stacked, and the thermoelectric conversion element may include a p-type thermoelectric conversion unit wherein the p-type semiconductor layer performs thermoelectric conversion and an n-type thermoelectric conversion unit wherein the n-type semiconductor layer performs thermoelectric conversion. According to this construction, thermoelectric conversion may be carried out at high sensitivity.

The present invention provides an electronic apparatus, comprising a thermoelectric conversion element including a said semiconductor layer which performs thermoelectric conversion using Seebeck effect, and at least one of a photoelectric conversion element in which at least a portion of the said semiconductor layer performs photoelectric conversion and a transistor or a diode having at least a portion of the said semiconductor layer as an operating layer, wherein the semiconductor layer includes a p-type semiconductor layer and an n-type semiconductor layer which are stacked, the thermoelectric conversion element includes a p-type thermoelectric conversion unit wherein the p-type semiconductor layer performs thermoelectric conversion and an n-type thermoelectric conversion unit wherein the n-type semiconductor layer performs thermoelectric conversion, and the photoelectric conversion element is a photodiode that uses the p-type semiconductor layer and the n-type semiconductor layer. According to this construction, monolithic integration of the thermoelectric conversion element and the photoelectric conversion element becomes much more feasible.

In the above construction, an isolation part may be provided between the p-type thermoelectric conversion unit and the n-type thermoelectric conversion unit so as to electrically isolate the p-type semiconductor layer and the n-type semiconductor layer. According to this construction, interference between the p-type semiconductor layer and the n-type semiconductor layer may be prevented.

In the above construction, an ohmic electrode formed on the said semiconductor layer disposed at an upper position among the p-type semiconductor layer and the n-type semiconductor layer may be a non-alloy ohmic electrode, and an ohmic electrode formed on the semiconductor layer disposed at a lower position among the p-type semiconductor layer and the n-type semiconductor layer may be an alloy ohmic electrode. According to this construction, the ohmic electrode formed on the said semiconductor layer at the upper position may be prevented from being electrically connected to the ohmic electrode formed on the said semiconductor layer at the lower position.

In the above construction, the said semiconductor layer may have a modulation doped structure. According to this construction, both desired sensitivity and detectability of the thermoelectric conversion element may be obtained.

In the above construction, the thermoelectric conversion element and the photoelectric conversion element may be provided in plural numbers such that the plurality of thermoelectric conversion elements and the plurality of photoelectric conversion elements are arranged in a matrix shape, and a selection part may be provided so as to select at least one among the plurality of thermoelectric conversion elements and the plurality of photoelectric conversion elements and may include the transistor.

The present invention provides a thermoelectric conversion apparatus, comprising a semiconductor layer including a p-type semiconductor layer and an n-type semiconductor layer which are stacked, a first thermoelectric conversion element including a first n-type thermoelectric conversion unit wherein the n-type semiconductor layer performs thermoelectric conversion and a first p-type thermoelectric conversion unit wherein the p-type semiconductor layer performs thermoelectric conversion, a second thermoelectric conversion element including a second n-type thermoelectric conversion unit wherein the n-type semiconductor layer performs thermoelectric conversion and a second p-type thermoelectric conversion unit wherein the p-type semiconductor layer performs thermoelectric conversion, a first beam including the first n-type thermoelectric conversion unit and the second p-type thermoelectric conversion unit, a second beam including the first p-type thermoelectric conversion unit and the second n-type thermoelectric conversion unit, and a central region to which the first beam and the second beam are connected and which includes a first isolation part for electrically isolating at least one of the p-type semiconductor layer and the n-type semiconductor layer between the first thermoelectric conversion element and the second thermoelectric conversion element, wherein the first thermoelectric conversion element and the second thermoelectric conversion element are connected in a series so that the first n-type thermoelectric conversion unit and the second p-type thermoelectric conversion unit are connected. According to the present invention, electrical interference between the first thermoelectric conversion element and the second thermoelectric conversion element may be prevented.

In the above construction, the first beam may include a second isolation part for electrically isolating the first n-type thermoelectric conversion unit and the second p-type thermoelectric conversion unit, and the second beam may include a third isolation part for electrically isolating the first p-type thermoelectric conversion unit and the second n-type thermoelectric conversion unit. According to this construction, electrical interference between the first thermoelectric conversion element and the second thermoelectric conversion element may be further prevented.

According to the present invention, a thermoelectric conversion element and at least one of a photoelectric conversion element and a transistor or a diode can be monolithically integrated.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
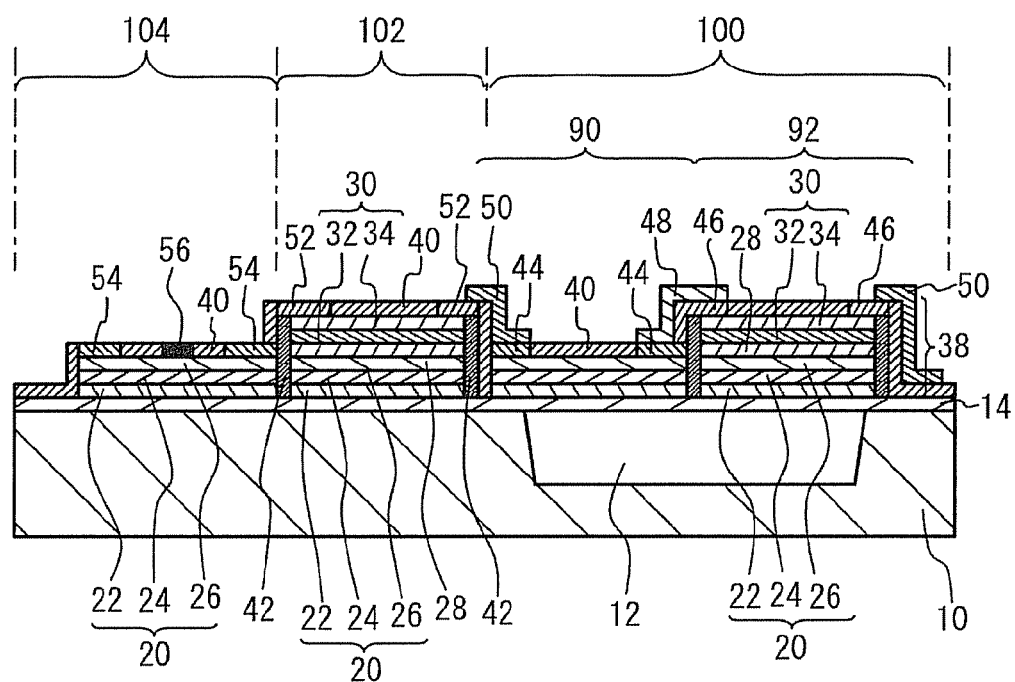
FIG. 1 is a cross-sectional view showing an electronic apparatus according to a first embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view showing an electronic apparatus according to a first embodiment. A thermoelectric conversion element 100, a photoelectric conversion element 102 and a transistor 104 are formed on a substrate 10. Sequentially placed on the substrate 10 made of Si are an etching stop layer 14, an n-type semiconductor layer 20, an electrical isolation layer 28 and a p-type semiconductor layer 30. A said semiconductor layer 38 includes the n-type semiconductor layer 20, the electrical isolation layer 28 and the p-type semiconductor layer 30. The thermoelectric conversion element 100 includes a p-type thermoelectric conversion unit 92 and an n-type thermoelectric conversion unit 90. The said semiconductor layer 38 between the thermoelectric conversion element 100, the photoelectric conversion element 102 and the transistor 104 is isolated by means of an isolation part 42 that is formed up to the upper surface of the etching stop layer 14. The p-type thermoelectric conversion unit 92 and the n-type thermoelectric conversion unit 90 are isolated by means of an isolation part 42 that is formed up to the upper surface of the etching stop layer 14.

In the p-type thermoelectric conversion unit 92, p-type ohmic electrodes 46 are formed at both sides on the p-type semiconductor layer 30. A passivation layer 40 is formed on the p-type semiconductor layer 30 between the p-type ohmic electrodes 46. In the n-type thermoelectric conversion unit 90, the p-type semiconductor layer 30 and the electrical isolation layer 28 are removed, and n-type ohmic electrodes 44 are formed at both sides on the n-type semiconductor layer 20. A passivation layer 40 is formed on the n-type semiconductor layer 20 between the n-type ohmic electrodes 44. An absorption part 48 is provided on one p-type ohmic electrode 46 and one n-type ohmic electrode 44 at a position where the p-type thermoelectric conversion unit 92 and the n-type thermoelectric conversion unit 90 are in contact. Cold pads 50 are respectively formed on the other p-type ohmic electrode 46 and the other n-type ohmic electrode 44. Furthermore, a cavity 12 is formed on the substrate 10 under the p-type thermoelectric conversion unit 92 and the n-type thermoelectric conversion unit 90.

In the photoelectric conversion element 102, p-type ohmic electrodes 52 are formed on the p-type semiconductor layer 30. A passivation layer 40 is formed on the p-type semiconductor layer 30 on which the p-type ohmic electrodes 52 are not formed. The passivation layer 40 may be formed of a material that permits light to pass therethrough at a wavelength at which the photoelectric conversion element 102 performs photoelectric conversion.

In the transistor 104, the p-type semiconductor layer 30 and the electrical isolation layer 28 are removed, and n-type ohmic electrodes 54 (e.g. a source electrode and a drain electrode) and a gate electrode 56 are provided on the n-type semiconductor layer 20. Furthermore, a passivation layer 40 is formed on the n-type semiconductor layer 20 between the n-type ohmic electrodes 54 and the gate electrode 56.

The layers ranging from the etching stop layer 14 to the p-type semiconductor layer 30 may be formed using for example MOCVD (Metal Organic Chemical Vapor Deposition). The etching stop layer 14 may include for example a 200 nm thick undoped $Al_xGa_{1-x}N$ layer (e.g. x=0.6). The n-type semiconductor layer 20 includes an undoped high-purity layer 22, an n-type doped electron supply layer 24 having a bandgap greater than the high-purity layer 22, and an ohmic contact layer 26. The high-purity layer 22 may include for example a 10 nm thick undoped GaN layer. The electron supply layer 24 may include for example a 100 nm thick $Al_xGa_{1-x}N$ layer (e.g. x=0.25) doped with Si at $1\times10^{18}$ cm$^{-3}$. The ohmic contact layer 26 may include for example a 30 nm thick GaN layer doped with Si at $4\times10^{18}$ cm$^{-3}$. The high-purity layer 22 and the electron supply layer 24 form a modulation doped structure, and a two-dimensional electron gas having high mobility is formed in the high-purity layer 22.

The electrical isolation layer 28 may include for example a 100 nm thick undoped GaN layer. The p-type semiconductor layer 30 includes an undoped high-purity layer 32 and a p-type doped hole supply layer 34 having a bandgap greater than the high-purity layer 32. The high-purity layer 32 may include for example a 10 nm thick undoped GaN layer. The hole supply layer 34 may include for example a 100 nm thick $Al_xGa_{1-x}N$ layer (e.g. x=0.25) doped with Mg at $1\times10^{19}$ cm$^{-3}$. The high-purity layer 32 and the hole supply layer 34 form a modulation doped structure, and a two-dimensional hole gas having high mobility is formed in the high-purity layer 32.

The isolation part 42 may be formed using for example the following method. Portions of the layers ranging from the p-type semiconductor layer 30 to the layer formed on the etching stop layer 14 are removed using etching to form a recess up to the upper surface of the etching stop layer 14. For example, a 500 nm thick insulator such as SiN or SiON is formed using CVD to fill the recess. Thereby, the isolation part 42 is formed. Also, the isolation part 42 may be formed by implanting ions to the semiconductor layer 38. Such ion implantation may be carried out for example using boron or oxygen under conditions of energy at 80 keV and a dose of $5\times10^{15}$ cm$^{-3}$. The absorption part 48 may include porous Au formed using vapor deposition. The cold pads 50 may include for example CrAu formed using vapor deposition. The passivation layer 40 may include for example a silicon oxide film or a silicon nitride film.

The p-type ohmic electrodes 46 and the p-type ohmic electrodes 52 may include for example non-alloy ohmic electrodes made by forming a Ni layer on the p-type semiconductor layer 30 and an Al layer on the Ni layer using vapor deposition. The n-type ohmic electrodes 44 and the n-type ohmic electrodes 54 may include for example alloy ohmic electrodes made by forming a Ti layer on the n-type semiconductor layer 20, and an Al layer on the Ti layer using vapor deposition and then performing thermal treatment. The gate electrode 56 may include for example a Pt layer formed using vapor deposition.

Figure 2:
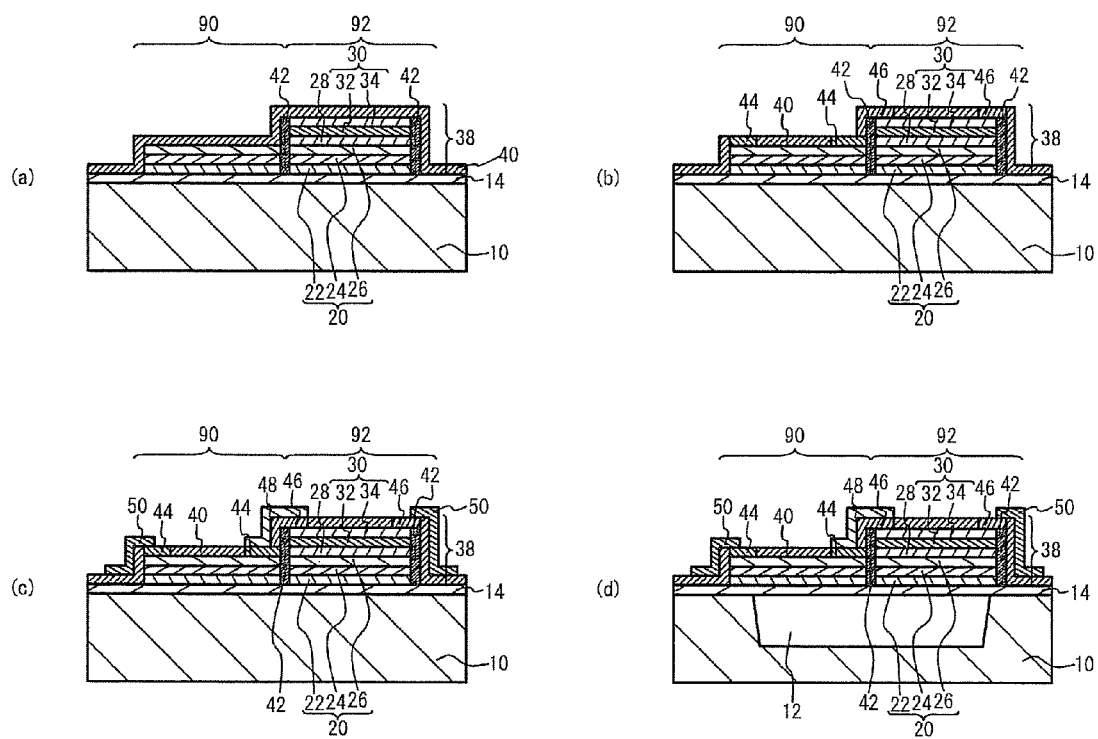
FIGS. 2(a)~2(d) are cross-sectional views showing a process of manufacturing a thermoelectric conversion element 100.

FIGS. 2(a)~2(d) are cross-sectional views showing a process of manufacturing the thermoelectric conversion element 100. As shown in FIG. 2(a), layers from the etching stop layer 14 to the p-type semiconductor layer 30 are formed on the substrate 10 using for example MOCVD. The isolation part 42 is formed. The p-type semiconductor layer 30 and the electrical isolation layer 28 corresponding to the region where the n-type thermoelectric conversion unit 90 is to be formed are removed. As such, the p-type semiconductor layer 30 and the electrical isolation layer 28 corresponding to the region where the transistor is to be formed are removed. The passivation layer 40 is formed so as to cover the p-type semiconductor layer 30 and the electrical isolation layer 28.

As shown in FIG. 2(b), portions of the passivation layer 40 are removed to form the p-type ohmic electrodes 46. As such, the p-type ohmic electrodes 52 of the photoelectric conversion element 102 are formed. Portions of the passivation layer 40 are removed to form the n-type ohmic electrodes 44. As such, the n-type ohmic electrodes 54 of the transistor 104 are formed.

As shown in FIG. 2(c), the cold pads 50 are respectively formed so as to come into contact with the p-type ohmic electrode 46 and the n-type ohmic electrode 44. The absorption part 48 is formed so as to come into contact with the p-type ohmic electrode 46 and the n-type ohmic electrode 44. As shown in FIG. 2(d), the cavity 12 is formed on the substrate 10 using etching. In this case, etching of the n-type semiconductor layer 20 may be prevented by means of the etching stop layer 14.

The isolation part 42 and the passivation layer 40 are formed as shown in FIG. 2(a) and then the cavity 12 is formed as shown in FIG. 2(d) in this way, thereby preventing damage to the semiconductor layer 38 due to the formation of the cavity 12. In particular, the formation of the cavity 12 is performed after the procedures of FIGS. 2(a)~2(c), whereby the procedures of FIGS. 2(a)~2(c) may be carried out unhindered.

As shown in FIG. 2(b), it is preferred that any one type of the p-type ohmic electrodes 46 and the n-type ohmic electrodes 44 is formed using a non-alloy process (a non-thermal treatment process) and the other type thereof is formed using an alloy process (a thermal treatment process for alloying). This is because the formation of the p-type ohmic electrodes 46 and the n-type ohmic electrodes 44 using an alloy process causes the alloy of one type of ohmic electrodes (thermal treatment for alloying) to break the alloy region of the other type of ohmic electrodes. Particularly in the case where the n-type semiconductor layer 20 and the p-type semiconductor layer 30 are stacked, it is preferred that ohmic electrodes that come into ohmic contact with the semiconductor layer located at an upper position among the n-type semiconductor layer 20 and the p-type semiconductor layer 30 are non-alloy ohmic electrodes, and that ohmic electrodes that come into ohmic contact with the semiconductor layer located at a lower position are alloy ohmic electrodes. If the ohmic electrodes on the semiconductor layer at the upper position are formed using an alloy process, the alloy region is distributed up to the semiconductor layer at the lower position. Thus, in the case where the semiconductor layer at the upper position is the p-type semiconductor layer 30 according to the first embodiment, the p-type ohmic electrodes 46 are preferably formed using a non-alloy process, and the n-type ohmic electrodes 44 are preferably formed using an alloy process. Also in the case where the n-type semiconductor layer is placed on the p-type semiconductor layer, the n-type ohmic electrodes are preferably formed using a non-alloy process and the p-type ohmic electrodes are preferably formed using an alloy process. Thereby, the ohmic electrodes formed on the semiconductor layer at the upper position may be prevented from being electrically connected to the semiconductor layer at the lower position.

With reference to FIG. 1, the thermoelectric conversion element 100 is described below. When the absorption part 48 absorbs for example IR rays, the temperature of the absorption part 48 increases. Because of the temperature difference between the absorption part 48 and the cold pads 50, there may occur thermoelectric conversion due to Seebeck effect in the semiconductor layer of the p-type thermoelectric conversion unit 92 and the n-type thermoelectric conversion unit 90. Thereby, an electromotive force is generated between the p-type ohmic electrodes 46 in the p-type thermoelectric conversion unit 92, and between the n-type ohmic electrodes 44 in the n-type thermoelectric conversion unit 90. The sensitivity R (V/W), detectability D (cm(Hz)$^{1/2}$/W) and response time τ(sec) of the thermoelectric conversion element 100 are respectively represented by Equations 1, 2, 3 below.

$$R = \alpha \cdot N \cdot S \cdot R_{th} \quad \text{Equation 1}$$

$$D = R(A \cdot \Delta f / (4 \cdot k_B \cdot T \cdot R_{el}))^{1/2} \quad \text{Equation 2}$$

$$\tau = R_{th} \cdot C \quad \text{Equation 3}$$

wherein α is the thermal absorption coefficient, N is a logarithm when a pair of the p-type thermoelectric conversion unit 92 and the n-type thermoelectric conversion unit 90 are connected in a series (which will be described in detail later), S is the Seebeck coefficient, $R_{th}$ is the thermal resistance of the semiconductor layer, A is the area of the absorption part 48, Δf is the bandwidth, $k_B$ is the Boltzmann coefficient, τ is the absolute temperature, $R_{el}$ is the electrical resistance of the semiconductor layer, and C is the heat capacity of the thermoelectric conversion unit.

In Equation 1, thermal resistance $R_{th}$ of the semiconductor layer should be increased to increase the sensitivity R. Hence, the semiconductor layer of the p-type thermoelectric conversion unit 92 and the n-type thermoelectric conversion unit 90 is thinned and provided in the form of a beam, and the cavity 12 is formed on the substrate 10, thereby increasing the thermal resistance $R_{th}$ of the semiconductor layer. However, when the p-type thermoelectric conversion unit 92 and the n-type thermoelectric conversion unit 90 are thinned and provided in the form of beam, the electrical resistance $R_{el}$ of the semiconductor layer may increase. Thereby, the detectability D decreases. Accordingly, the n-type semiconductor layer 20 and the p-type semiconductor layer 30 include a modulation doped structure, so that two-dimensional electrons and two-dimensional holes, having high mobility, are formed. Thus, the electrical resistance $R_{el}$ of the n-type semiconductor layer 20 and the p-type semiconductor layer 30 may decrease. Thereby, both desired sensitivity R and detectivity D* may be obtained.

Also with reference to FIG. 1, the photoelectric conversion element 102 is described below. The photoelectric conversion element 102 has a PIN structure comprising the p-type semiconductor layer 30, the electrical isolation layer 28 and the n-type semiconductor layer 20. The PIN structure enables the photoelectric conversion of irradiated light.

Also with reference to FIG. 1, the transistor 104 is described below. The transistor 104 has a HEMT (High Electron Mobility Transistor) structure having a two-dimensional electron gas channel formed in the modulation doped structure of the n-type semiconductor layer 20. In this way, the n-type semiconductor layer 20 which is a portion of the semiconductor layer 38 may be used as an operating layer. In the transistor 104, the p-type semiconductor layer 30 may be used as an operating layer. Also in the transistor 104, the gate electrode 56 is able to act as an anode and the n-type ohmic electrodes 54 are able to act as a cathode, so that the transistor 104 may function as a diode.

According to the first embodiment, the thermoelectric conversion element 100 includes the semiconductor layer 38 that performs thermoelectric conversion. In the photoelectric conversion element 102, at least a portion of the said semiconductor layer 38 performs photoelectric conversion. Thus, when the photoelectric conversion element 102 performs photoelectric conversion using at least the portion of the semiconductor layer 38 that performs thermoelectric conversion in this way, the thermoelectric conversion element 100 and the photoelectric conversion element 102 may be monolithically integrated. The thermoelectric conversion element 100 enables the detection of light in a wide range from far IR to near IR. Meanwhile, the photoelectric conversion element 102 detects light in a narrow range corresponding to the bandgap of the semiconductor layer. Thus, monolithic integration of a wide-range detector and a narrow-range detector is possible.

Also in the transistor 104, at least a portion of the said semiconductor layer 38 may be used as an operating layer. Thereby, the thermoelectric conversion element 100 and the transistor 104 may be monolithically integrated. Alternatively instead of the transistor, for example a diode may be utilized.

As mentioned above, the thermoelectric conversion element 100, and at least one of the photoelectric conversion element 102 and the transistor 104 may be monolithically integrated. Alternatively instead of the transistor, for example a diode may be used.

Furthermore, the said semiconductor layer 38 includes a layer having bandgap energy corresponding to UV light (in the first embodiment, a GaN layer, an AlGaN layer), and at least a portion of the said semiconductor layer 38 of the photoelectric conversion element 102 performs the photoelectric conversion of UV light. Hence, the photoelectric conversion element 102 may act as a UV detector for detecting UV light. The absorption part 48 of the thermoelectric conversion element 100 may act as an IR absorption part that absorbs IR rays and converts them into heat. Hence, the thermoelectric conversion element 100 may act as an IR detector for detecting IR rays. Thereby, the UV detector and the IR detector may be monolithically integrated.

The semiconductor layer having a bandgap corresponding to UV light may include a said semiconductor layer 38 made of GaN or a mixture of crystals of AlN and GaN as illustrated in the first embodiment. Alternatively a semiconductor layer containing ZnO may be used. For example, ZnO or a mixture of crystals of ZnO and MgO may be used for the semiconductor layer. Also, ZnS, ZnSe, MgS or MgSe may be used.

The said semiconductor layer 38 includes the p-type semiconductor layer 30 and the n-type semiconductor layer 20 which are stacked. The thermoelectric conversion element 100 includes the p-type thermoelectric conversion unit 92 wherein the p-type semiconductor layer 30 performs thermoelectric conversion, and the n-type thermoelectric conversion unit 90 wherein the n-type semiconductor layer 20 performs thermoelectric conversion. Thereby, thermoelectric conversion may be carried out at high sensitivity.

Also, the photoelectric conversion element 102 is a photodiode that uses the p-type semiconductor layer 30 and the n-type semiconductor layer 20. Thereby, monolithic integration of the thermoelectric conversion element 100 and the photoelectric conversion element 102 becomes much more feasible.

Also, the isolation part 42 is provided between the p-type thermoelectric conversion unit 92 and the n-type thermoelectric conversion unit 90 so as to electrically isolate the p-type semiconductor layer 30 and the n-type semiconductor layer 20. Thereby, interference between the p-type semiconductor layer 30 and the n-type semiconductor layer 20 may be prevented.

Figure 3:
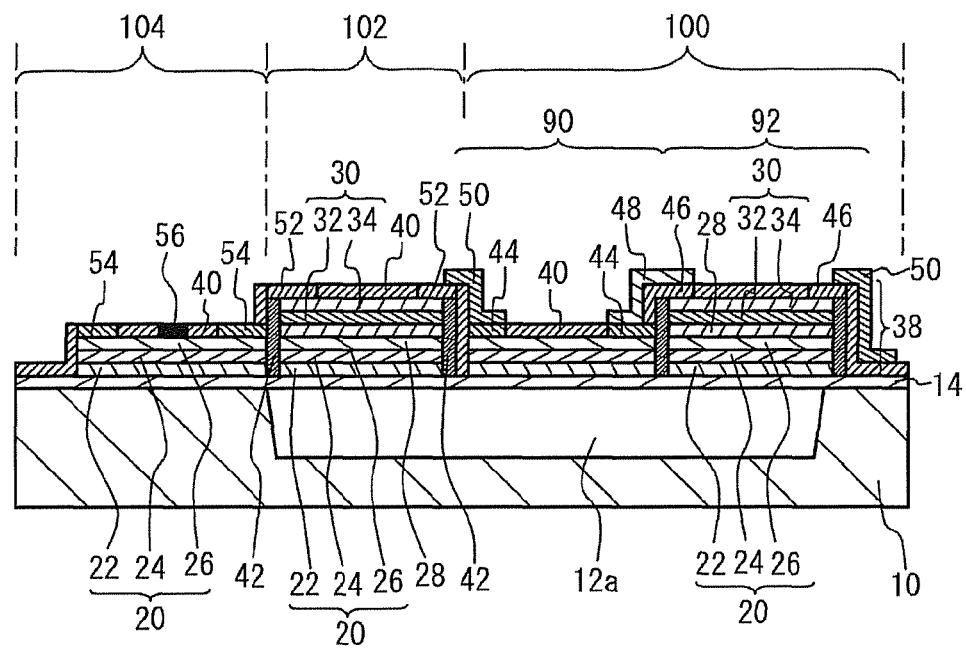
FIG. 3 is a cross-sectional view showing a modification of the first embodiment.

FIG. 3 is a cross-sectional view showing a modification of the first embodiment. As shown in FIG. 3, a cavity 12*a* may also be formed on the substrate 10 under the photoelectric conversion element 102. When the cavity 12*a* is formed on the substrate 10 under the photoelectric conversion element 102 in this way, noise caused by the absorption of light due to photoelectric effects may be suppressed in the substrate 10 made of for example Si.

Figure 4:
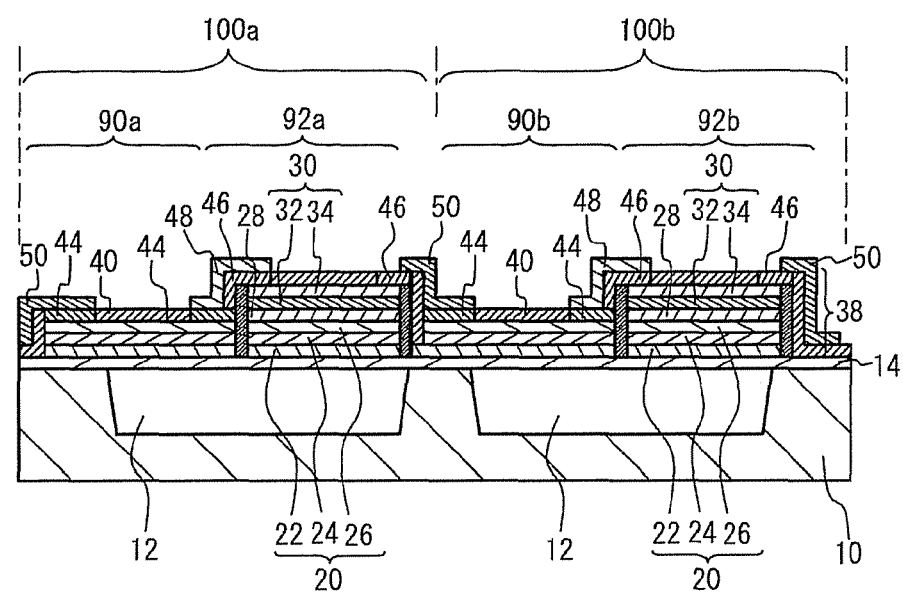
FIG. 4 is a cross-sectional view showing a thermoelectric conversion apparatus according to a second embodiment.

According to a second embodiment, there is provided a thermoelectric conversion apparatus. FIG. 4 is a cross-sectional view showing the thermoelectric conversion apparatus according to the second embodiment. As shown in FIG. 4, the thermoelectric conversion apparatus is configured such that a first thermoelectric conversion element 100*a* and a second thermoelectric conversion element 100*b* as described in the first embodiment are connected in a series. Also, a first n-type thermoelectric conversion unit 90*a* and a first p-type thermoelectric conversion unit 92*a* of the first thermoelectric conversion element 100*a*, and a second n-type thermoelectric conversion unit 90*b* and a second p-type thermoelectric conversion unit 92*b* of the second thermoelectric conversion element 100*b* are connected in a series.

Figure 5:
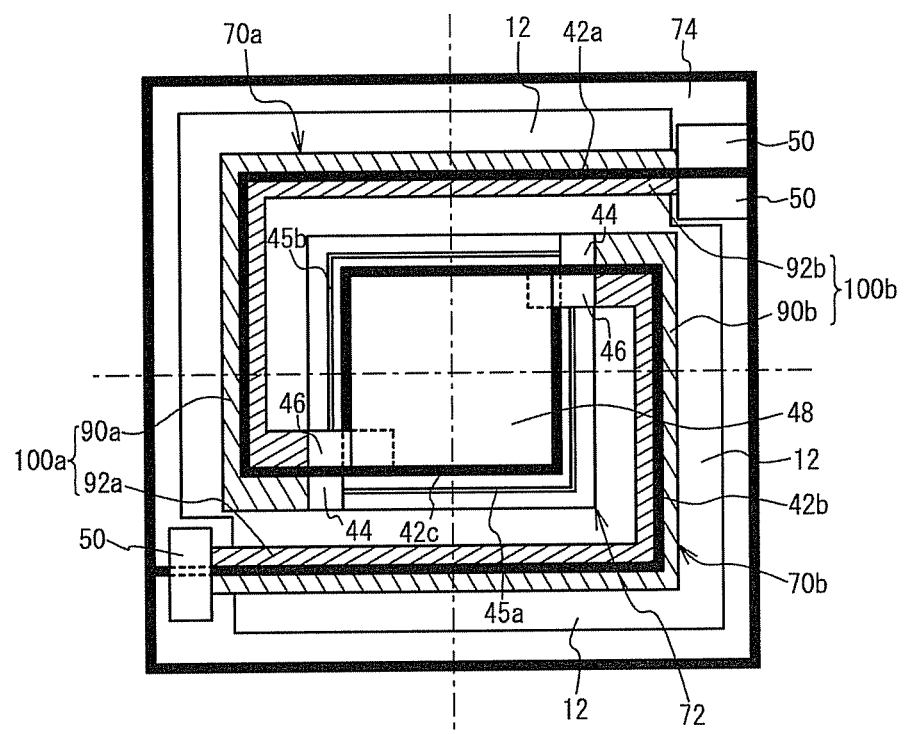
FIG. 5 is a top plan view showing the thermoelectric conversion apparatus.

FIG. 5 is a top plan view showing the thermoelectric conversion apparatus according to the second embodiment. The thermoelectric conversion apparatus includes a central region 72, a first beam 70*a* and a second beam 70*b*. The first beam 70*a* and the second beam 70*b* are separated from the substrate 10 by means of cavities 12 as shown in FIG. 4. One end of each of the first beam 70*a* and the second beam 70*b* is mechanically connected to the central region 72. The other end of each of the first beam 70*a* and the second beam 70*b* is mechanically connected to an external support 74. The first beam 70*a* is provided with the first n-type thermoelectric conversion unit 90*a* of the first thermoelectric conversion element 100*a* and the second p-type thermoelectric conversion unit 92*b* of the second thermoelectric conversion element 100*b*. The semiconductor layer between the first n-type thermoelectric conversion unit 90*a* and the second p-type thermoelectric conversion unit 92*b* is electrically isolated by means of a second isolation part 42*a*. The second beam 70*b* is provided with the second n-type thermoelectric conversion unit 90*b* of the second thermoelectric conversion element 100*b* and the first p-type thermoelectric conversion unit 92*a* of the first thermoelectric conversion element 100*a*. The semiconductor layer between the second n-type thermoelectric conversion unit 90*b* and the first p-type thermoelectric conversion unit 92*a* is electrically isolated by means of a third isolation part 42*b*.

Provided at the center of the central region 72 is an absorption part 48. Also provided around the central region 72 is a first wire 45*a* that connects n-type ohmic electrodes 44 of the first n-type thermoelectric conversion unit 90*a* and p-type ohmic electrodes 46 of the first p-type thermoelectric conversion unit 92*a*. Furthermore, a second wire 45*b* is provided, which connects n-type ohmic electrodes 44 of the second n-type thermoelectric conversion unit 90*b* and p-type ohmic electrodes 46 of the second p-type thermoelectric conversion unit 92*b*. Moreover, a first isolation part 42*c* of the central region 72 is provided between the absorption part 48 and the first wire 45*a* and between the absorption part 48 and the second wire 45*b*, and functions to electrically isolate the first thermoelectric conversion element 100*a* and the second thermoelectric conversion element 100*b*. Also, the p-type ohmic electrode 46 positioned between the lower surface of the absorption part 48 and the upper surface of the first isolation part 42*c* is thermally connected to the absorption part 48. The first isolation part 42*c* underneath the p-type ohmic electrode 46 is represented by a dashed line. Also, the p-type ohmic electrode 46 underneath the absorption part 48 is represented by a dashed line. The other end of each of the first beam 70*a* and the second beam 70*b* is provided with the cold pad 50. The second isolation part 42*a*, the third isolation part 42*b* and the first isolation part 42*c* function to electrically isolate the semiconductor layer 38 on the etching stop layer 14 as in the isolation part 42 according to the first embodiment. The width and length of each of the first beam 70*a* and the second beam 70*b* may be for example 6 μm and 152 μm, respectively. Each side of the central region 72 is for example 52 μm.

According to the second embodiment, the first beam 70*a* and the second beam 70*b* are provided with the thermoelectric conversion units, thereby greatly increasing thermal resistance and sensitivity. The first thermoelectric conversion element 100*a* and the second thermoelectric conversion element 100*b* are connected in a series so that the first p-type thermoelectric conversion unit 92*a* and the second n-type thermoelectric conversion unit 90*b* are connected to the support 74 at the left lower position of FIG. 5. The first n-type thermoelectric conversion unit 90*a* and the second p-type thermoelectric conversion unit 92*b* are provided to the first beam 70*a*. The second n-type thermoelectric conversion unit 90*b* and the first p-type thermoelectric conversion unit 92*a* are provided to the second beam 70*b*. Thereby, the logarithm N of Equation 1 may be set to 2, thus greatly increasing the sensitivity.

In the central region 72 to which the first beam 70a and the second beam 70b are connected, the first isolation part 42c is further provided, which electrically isolates at least one of the p-type semiconductor layer 30 and the n-type semiconductor layer 20 between the first thermoelectric conversion element 100a and the second thermoelectric conversion element 100b. In the case where the central region 72 includes at least one of the p-type semiconductor layer 30 and the n-type semiconductor layer 20, the first thermoelectric conversion element 100a and the second thermoelectric conversion element 100b may electrically interfere due to the semiconductor layer at the central region 72. Hence, the first isolation part 42c electrically isolates at least one of the p-type semiconductor layer 30 and the n-type semiconductor layer 20. Thereby, electrical interference between the first thermoelectric conversion element 100a and the second thermoelectric conversion element 100b may be prevented. Particularly in the case where at least one of the p-type ohmic electrodes 46 and the n-type ohmic electrodes 44 is formed using an alloy process, electrical interference between the first thermoelectric conversion element 100a and the second thermoelectric conversion element 100b may be facilitated due to the conductive semiconductor layer corresponding to the ohmic electrode formed using an alloy process. Accordingly, it is preferred that the first isolation part 42c of the central region 72 electrically isolates the conductive semiconductor layer corresponding to the ohmic electrode formed using an alloy process.

Also, the first beam 70a preferably includes the second isolation part 42a that electrically isolates the first n-type thermoelectric conversion unit 90a and the second p-type thermoelectric conversion unit 92b, and the second beam 70b preferably includes the third isolation part 42b that electrically isolates the first p-type thermoelectric conversion unit 92a and the second n-type thermoelectric conversion unit 90b. Thereby, electrical interference between the first thermoelectric conversion element 100a and the second thermoelectric conversion element 100b in the first beam 70a and the second beam 70b may be further prevented.

Figure 6:
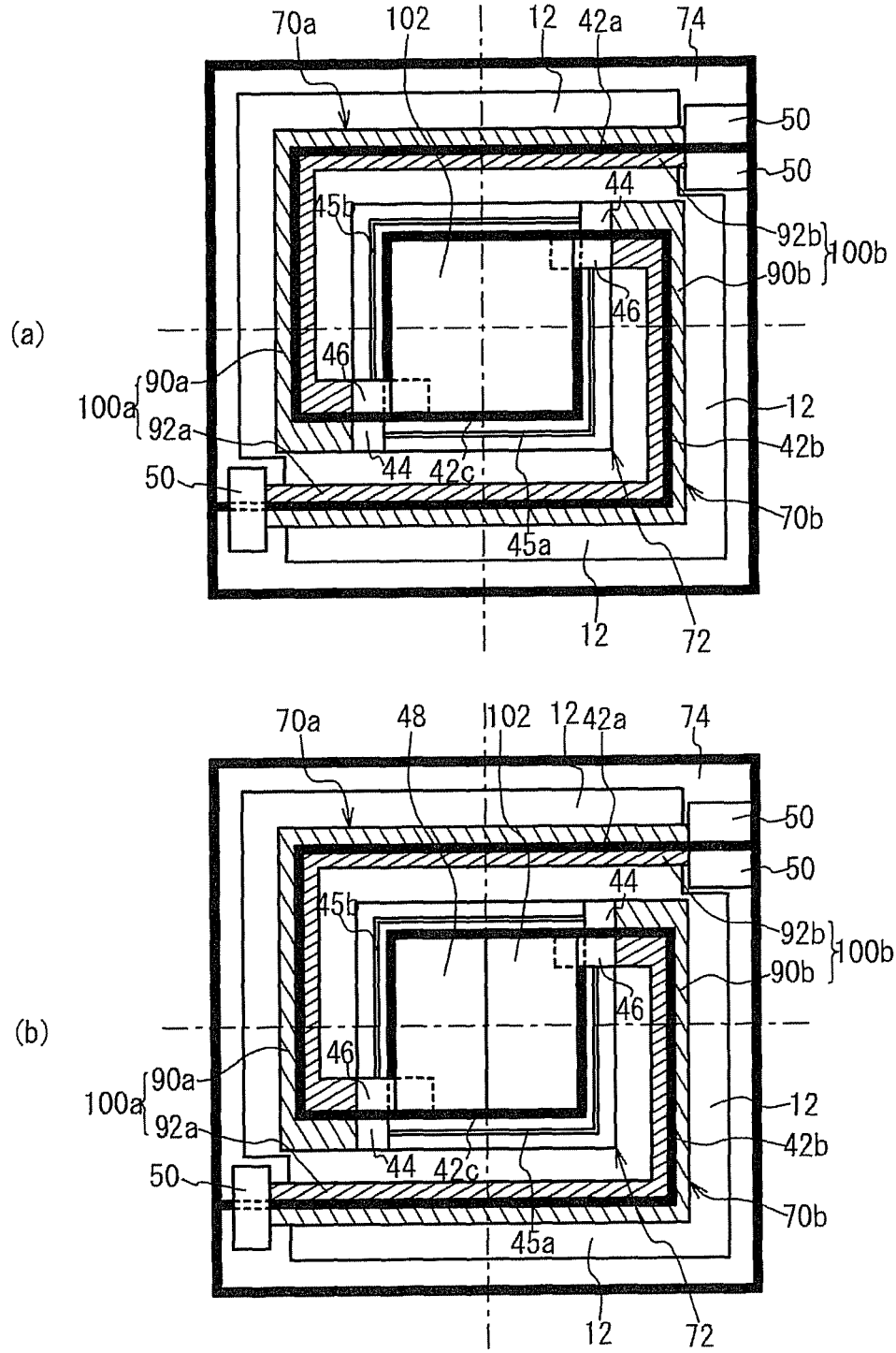
FIGS. 6(a) and 6(b) are top plan views showing modifications of the second embodiment.

FIGS. 6(a) and 6(b) are top plan views showing modifications of the second embodiment. As shown in FIG. 6(a), the photoelectric conversion element 102 may be provided in the central region 72. As shown in FIG. 6(b), both the photoelectric conversion element 102 and the absorption part 48 may be provided in the central region 72.

Figure 7:
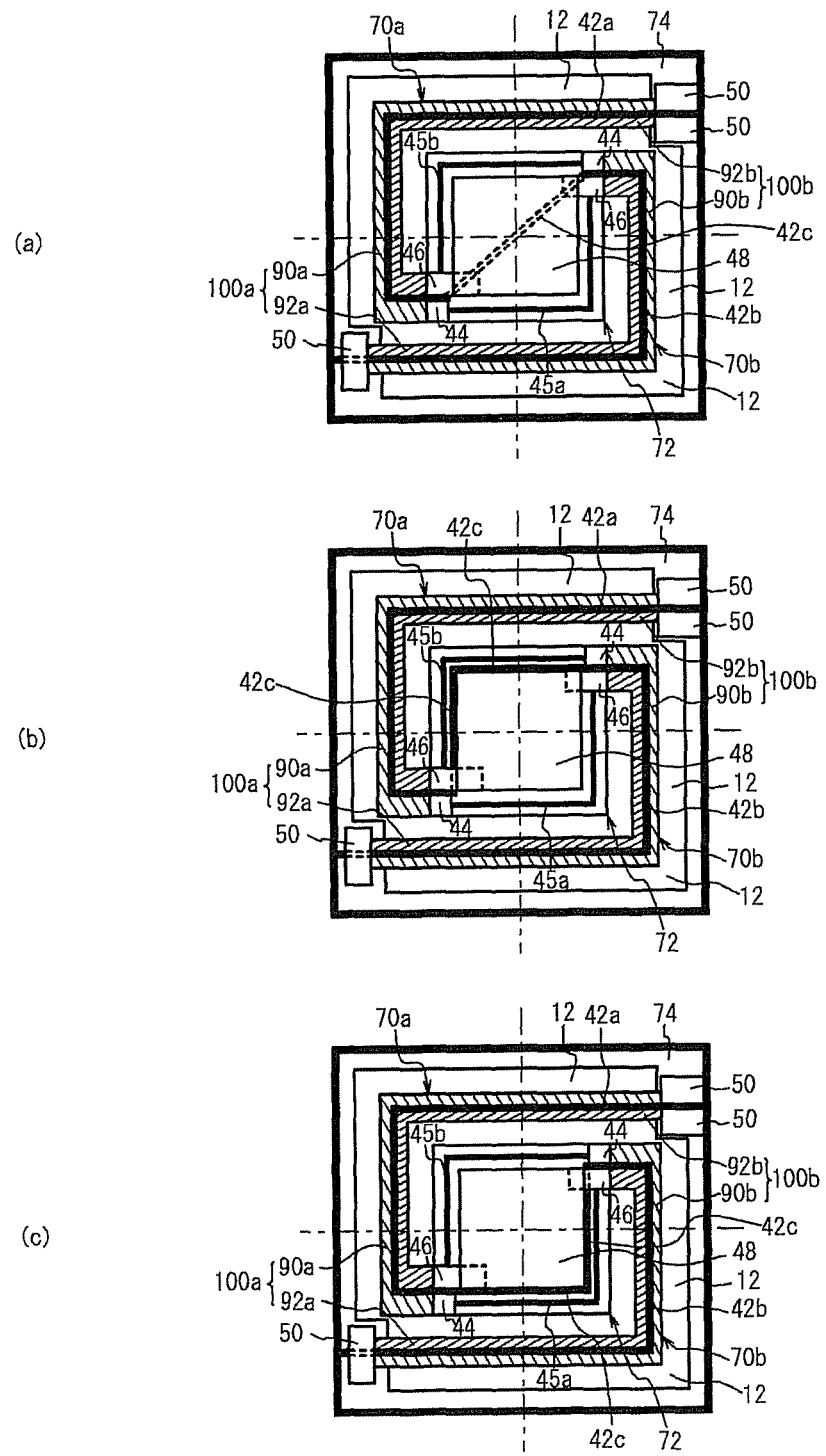
FIGS. 7(a) to 7(c) are top plan views showing the other modifications of the second embodiment.

FIGS. 7(a)–7(c) are top plan views showing the other modifications of the second embodiment. As shown in FIG. 7(a), the first isolation part 42c of the central region 72 may be provided so as to cross the absorption part 48. The first isolation part 42c under the absorption part 48 is represented by a dotted line. As shown in FIG. 7(b), the first isolation part 42c is provided between the absorption part 48 and the wire 45b, and may not be provided between the absorption part 48 and the wire 45a. As shown in FIG. 7(c), the first isolation part 42c is provided between the absorption part 48 and the wire 45a, and may not be formed between the absorption part 48 and the wire 45b. In this way, the first isolation part 42c may be provided so as to electrically isolate the first thermoelectric conversion element 100a and the second thermoelectric conversion element 100b. In particular, the first isolation part 42c is provided so that there is no spacing between the first thermoelectric conversion element 100a and the second thermoelectric conversion element 100b, whereby the first thermoelectric conversion element 100a and the second thermoelectric conversion element 100b may be completely electrically isolated.

The sensitivity R and the detectivity D* of the thermoelectric conversion apparatus using GaN and AlGaN are calculated. First, the sensitivity R is calculated using Equation 1. It is supposed that the thermal absorption coefficient $\alpha$ is 1, the logarithm N is 2 and the Seebeck coefficient S of GaN is 1500 $\mu$V/K. The thermal resistance $R_{th}$ is calculated from the length L of each of the first beam 70a and the second beam 70b, the width W of each of the p-type thermoelectric conversion unit 92 and the n-type thermoelectric conversion unit 90, and the thicknesses tp, tn of the semiconductor layer of the p-type thermoelectric conversion unit 92 and the n-type thermoelectric conversion unit 90. For example, at L=137 $\mu$m, W=1.5 $\mu$m, tp=0.55 mm and tn=0.34 $\mu$m, $R_{th}$ is 3.4×10$^5$ K/W. As such, the sensitivity R is 2000 V/W.

Figure 8:
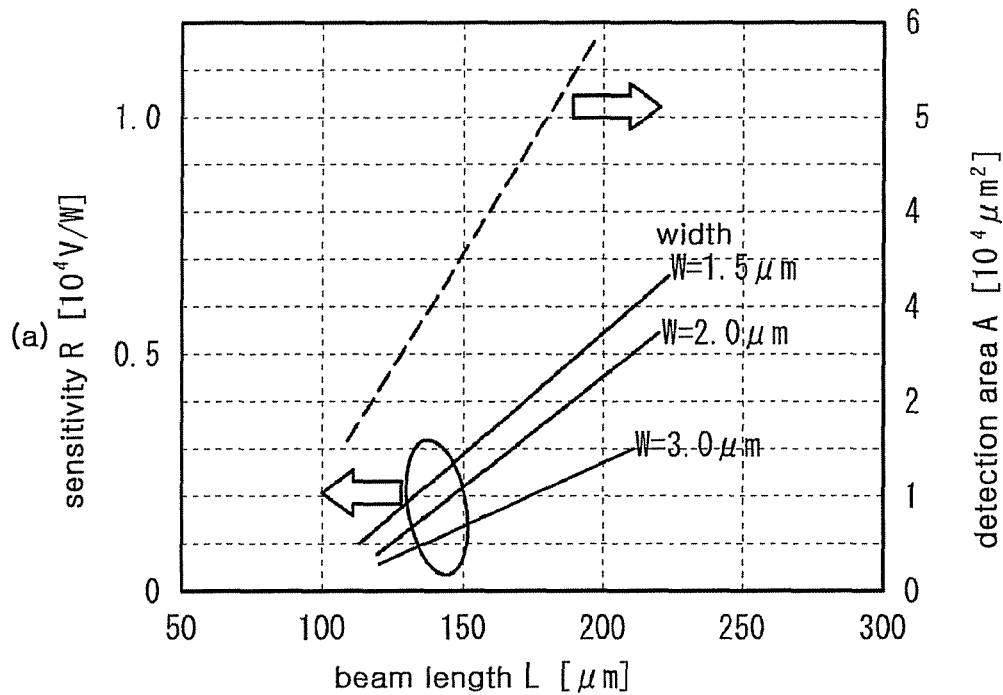
FIG. 8(a) shows the sensitivity R of a thermoelectric conversion apparatus using AlGaN/GaN with respect to changes in L and W.
FIG. 8(b) shows the detectability D and the response time τ with respect to changes in L and W.
Figure 8:
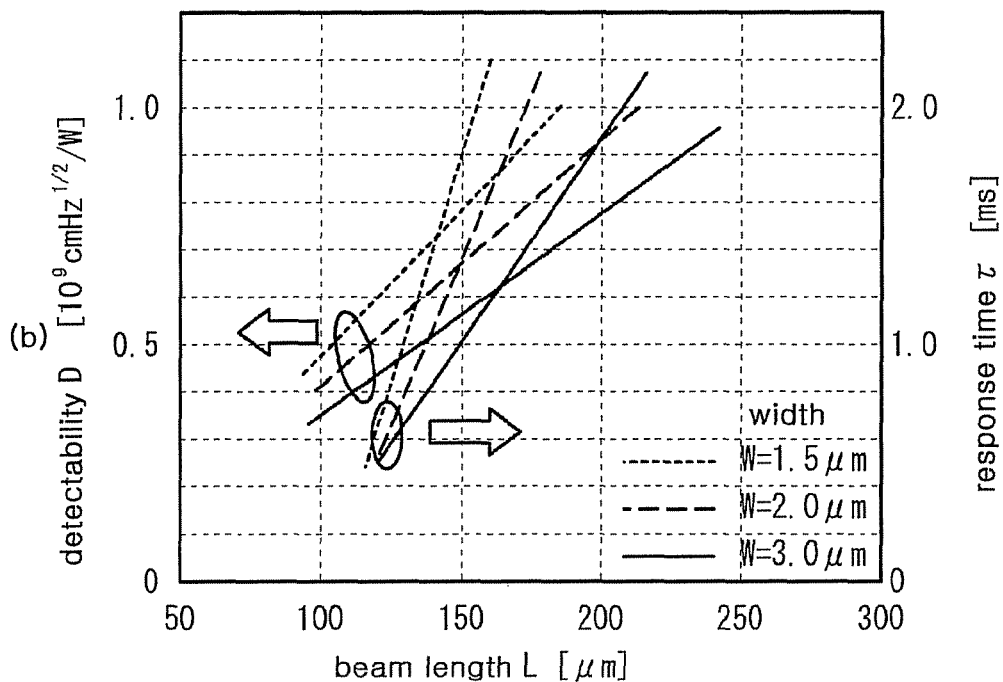

FIG. 8(a) shows the sensitivity R with respect to changes in L and W of the thermoelectric conversion apparatus using AlGaN/GaN. As shown in FIG. 8(a), the sensitivity R increases in proportion to an increase in L and to a decrease in W.

The detectivity D* is calculated using Equation 2. On the assumption of bandwidth $\Delta f=1$ and the absolute temperature T=300K, the area A of the absorption part 48 is supposed to be in proportion to L as shown in FIG. 8(a). The electrical resistance $R_{el}$ is calculated from L and W. For example, at the area A=52×52 $\mu$m$^2$, L=137 $\mu$m and W=1.5 $\mu$m, $R_{el}$ is 320 k$\Omega$. As such, the detectivity D* is 7×10$^8$ cm(Hz)$^{1/2}$/W. On the assumption that the heat capacity C is 4×10$^{-9}$ J/K, the response time $\tau$ is 1.3 ms.

FIG. 8(b) shows the detectability D and the response time $\tau$ with respect to changes in L and W of the thermoelectric conversion apparatus using AlGaN/GaN. As shown in FIG. 8(b), the detectability D increases in proportion to an increase in L and to a decrease in W.

Figure 10:
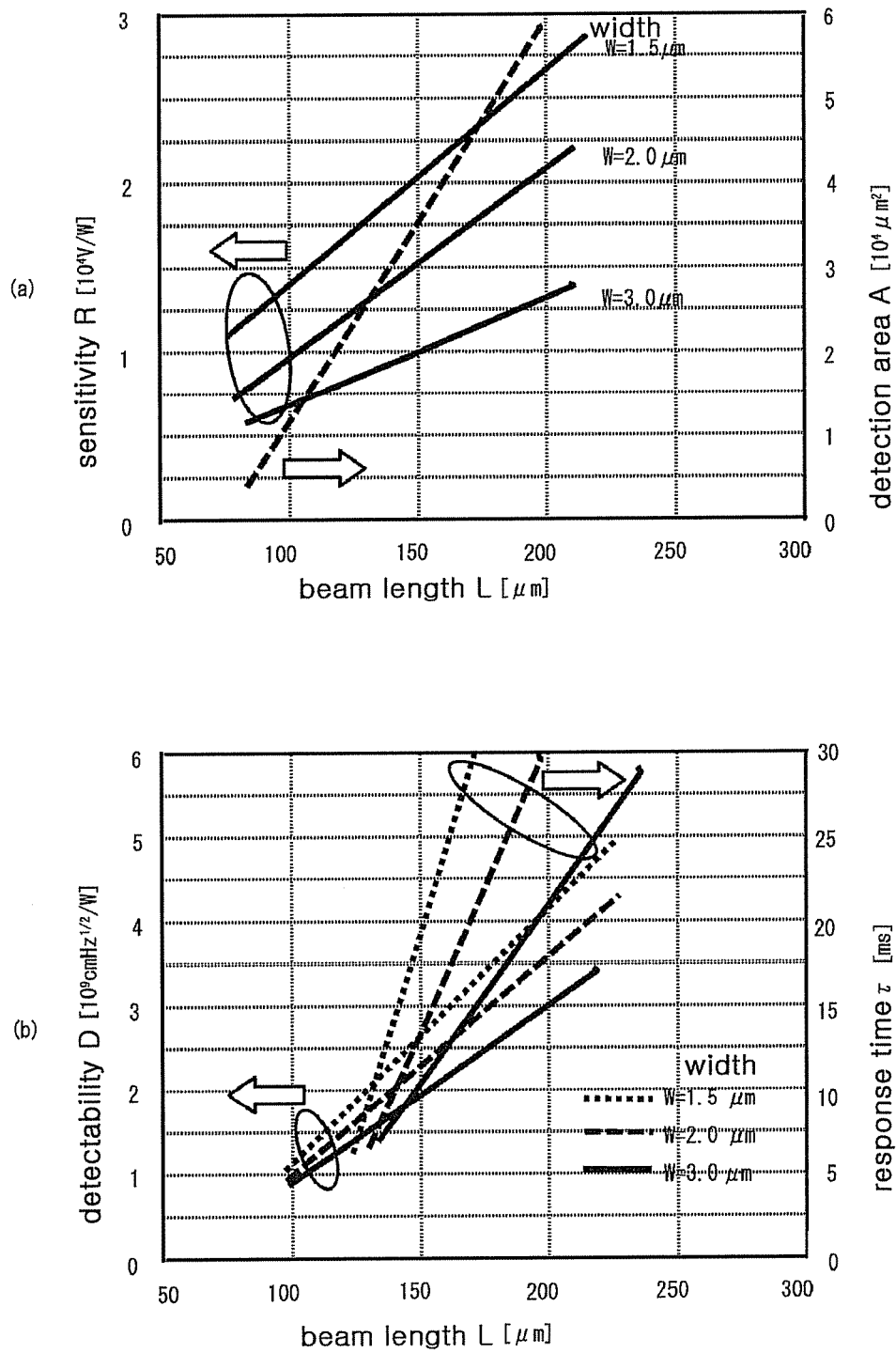
FIG. 10(a) shows the sensitivity R of a thermoelectric conversion apparatus using AlGaAs/InGaAs with respect to changes in L and W.
FIG. 10(b) shows the detectability D and the response time τ with respect to changes in L and W.

As in FIGS. 10(a) and 10(b), the sensitivity R and the detectability D of the thermoelectric conversion apparatus using ZnO and ZnMgO are calculated. First, the sensitivity R is calculated using Equation 1. It is supposed that the thermal absorption coefficient $\alpha$ is 1, the logarithm N is 2, and the Seebeck coefficient S of ZnO is 1140 UV/K. As in FIG. 8(a), the thermal resistance $R_{th}$ is calculated from L, W, tp and tn. For example, at L=137 $\mu$m, W=1.5 $\mu$m, tp=0.55 $\mu$m and tn=0.34 $\mu$m, $R_{th}$ is 1.75×10$^6$ K/W. As such, the sensitivity R is 8000 V/W.

Figure 9:
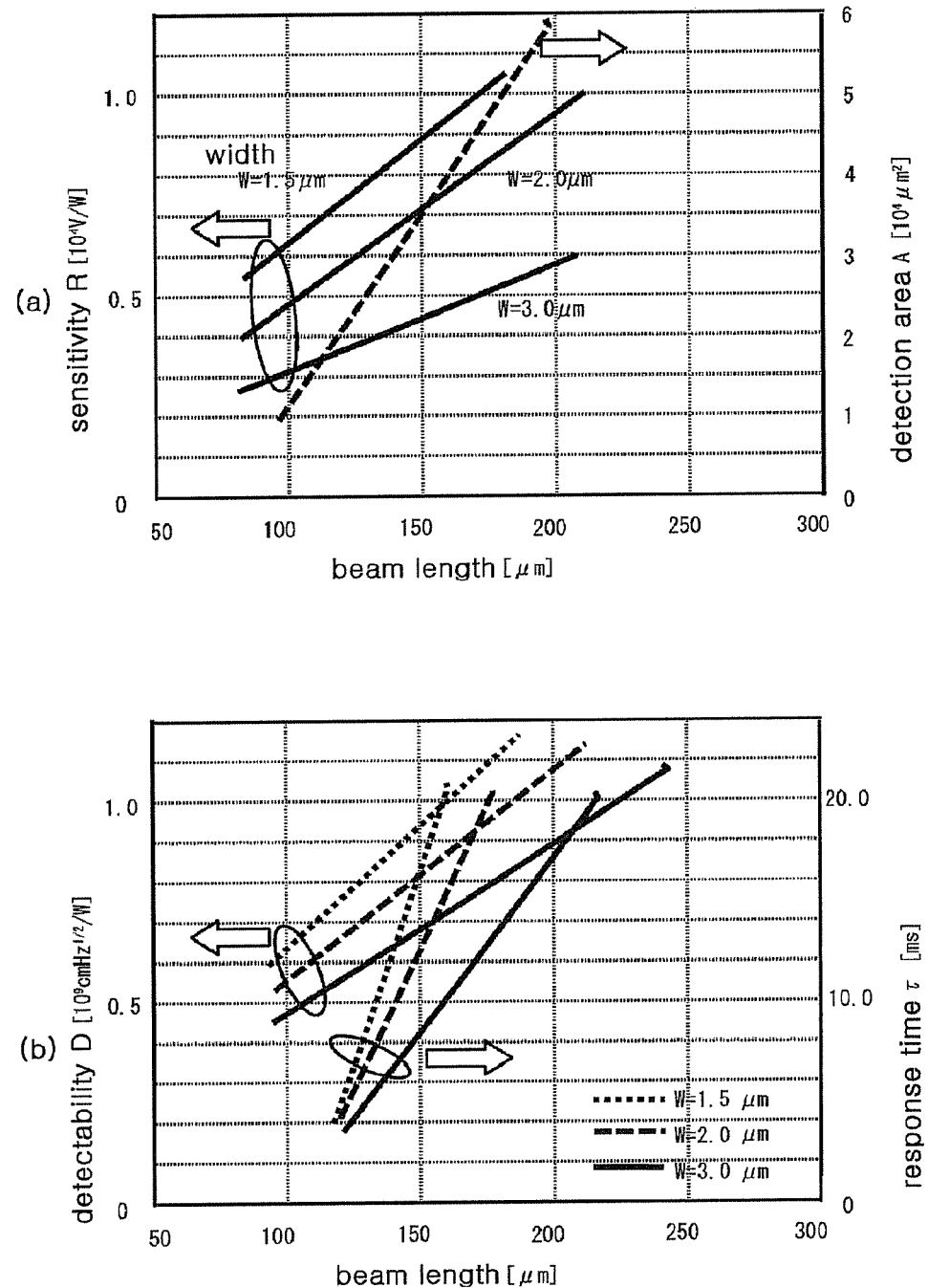
FIG. 9(a) shows the sensitivity R of a thermoelectric conversion apparatus using MgZnO/ZnO with respect to changes in L and W.
FIG. 9(b) shows the detectability D and the response time τ with respect to changes in L and W.

FIG. 9(a) shows the sensitivity R with respect to changes in L and W. As shown in FIG. 9(a), R increases in proportion to an increase in L and to a decrease in W.

The detectivity D* is calculated using Equation 2. On the assumption of bandwidth $\Delta f=1$ and the absolute temperature T=300K, the area A of the absorption part 48 is supposed to be in proportion to L as shown in FIG. 9(a). The electrical resistance $R_{el}$ is calculated from L and W. For example, at the area A=52×52 $\mu$m$^2$, L=137 $\mu$m and W=1.5 $\mu$m, $R_{el}$ is 310 k$\Omega$. As such, the detectivity D* is 8×10$^8$ cm(Hz)$^{112}$/W. On the assumption that the heat capacity C is 5.3×10$^{-9}$ J/K, the response time $\tau$ is 9.2 ms.

FIG. 9(b) shows the detectivity D* and the response time $\tau$ with respect to changes in L and W of the thermoelectric conversion apparatus using ZnO/MgZnO. As shown in FIG. 9(b), the detectability D increases in proportion to an increase in L and to a decrease in W.

As shown in FIGS. 8(a)–9(b), it is preferred that the beam length L is 100 $\mu$m or more. Particularly in the AlGaN/GaN modulation doped structure or in the ZnO/MgZnO modulation doped structure, the beam length L may be 100 mm or more.

The thermoelectric conversion apparatus according to the second embodiment, and at least one of the photoelectric conversion element and the transistor according to the first embodiment may be monolithically integrated.

According to a third embodiment, there is provided a photoelectric conversion element that detects IR rays. As shown in FIG. 1 according to the first embodiment, the etching stop layer 14 may include for example a 200 nm thick undoped $Al_xGa_{1-x}Aa$ layer (e.g. x=0.6). The high-purity layer 22 may include for example a 10 nm thick undoped $In_xGa_{1-x}As$ layer (e.g. x=0.25). The electron supply layer 24 may include for example a 100 nm thick $Al_xGa_{1-x}As$ layer (e.g. x=0.25) doped with Si at $1\times10^{18}$ cm$^{-3}$. The ohmic contact layer 26 may include for example a 30 nm thick GaAs layer doped with Si at $4\times10^{18}$ cm$^{-3}$.

The electrical isolation layer 28 may include for example a 100 nm thick undoped GaAs layer. The high-purity layer 32 may include for example a 10 nm thick undoped $In_xGa_{1-x}As$ layer (e.g. x=0.25). The hole supply layer 34 may include for example a 100 nm thick $Al_xGa_{1-x}As$ layer (e.g. x=0.25) doped with Zn at $1\times10^{19}$ cm$^{-3}$.

The p-type ohmic electrodes 46 and the p-type ohmic electrodes 52 may include for example non-alloy ohmic electrodes made by forming a Ti layer on the p-type semiconductor layer 30, and an Au layer on the Ti layer using vapor deposition. The n-type ohmic electrodes 44 and the n-type ohmic electrodes 54 may include for example alloy ohmic electrodes made by forming an AuGe layer on the n-type semiconductor layer, and a Ni layer on the AuGe layer using vapor deposition and then performing thermal treatment.

The sensitivity R and the detectability D of the same thermoelectric conversion apparatus as in the second embodiment are calculated. First, the sensitivity R is calculated using Equation 1. It is supposed that the thermal absorption coefficient α is 1, the logarithm N is 2 and the Seebeck coefficient S of InGaAs is 1250/V/K. For example, at L=137 mm, W=1.5 μm, tp=0.55 μm and tn=0.34 μm, $R_{th}$ is $3.6\times10^6$ K/W. As such, the sensitivity R is 18000 V/W.

FIG. 10(a) shows the sensitivity R with respect to changes in L and W of the thermoelectric conversion apparatus using AlGaAs/InGaAs. As shown in FIG. 10(a), R increases in proportion to an increase in L and to a decrease in W.

The detectability D is calculated using Equation 2. On the assumption of bandwidth Δf=1 and the absolute temperature T=300K, the area A of the absorption part 48 is supposed to be in proportion to L as shown in FIG. 10(a). The electrical resistance $R_{el}$ is calculated from L and W. For example, at the area A=52×52 μm$^2$, L=137 μm and W=1.5 μm, $R_{el}$ is 420 kΩ. As such, the detectivity D* is $2.27\times10^9$ cm(Hz)$^{1/2}$/W. On the assumption that the heat capacity C is $3.5\times10^{-9}$ J/K, the response time τ is 13 ms.

FIG. 10(b) shows the detectivity D* and the response time τ with respect to changes in L and W of the thermoelectric conversion apparatus using AlGaAs/InGaAs. As shown in FIG. 10(b), the detectivity D* increases in proportion to an increase in L and to a decrease in W.

As shown in FIGS. 8(a)~10(b), in the case where the thermoelectric conversion element is formed using the semiconductor layer including GaN as in the second embodiment, the sensitivity R and the detectability D are lower than in the thermoelectric conversion element including GaAs according to the third embodiment, but the response time τ may be faster. According to the third embodiment, the sensitivity R and the detectability D of the thermoelectric conversion element including GaAs may increase.

According to the third embodiment, the semiconductor layer 38 includes a layer (e.g. InGaAs) having bandgap energy corresponding to IR rays. In the photoelectric conversion element 102, at least a portion of the semiconductor layer converts IR rays into an electrical signal. Thereby, the thermoelectric conversion element 100 may detect IR rays in the wide range from far IR to near IR. On the other hand, the photoelectric conversion element 102 may detect IR rays corresponding to the bandgap of the semiconductor layer. Thus, the wide-range IR detector (which is a far IR detector at a wavelength of about 10 μm) and the narrow-range IR detector (which is a near IR detector at a wavelength of about 1 μm) may be monolithically integrated. The third embodiment may be applied to for example an image sensor for detecting both the wide-range IR rays and the narrow-range IR rays.

Figure 11:
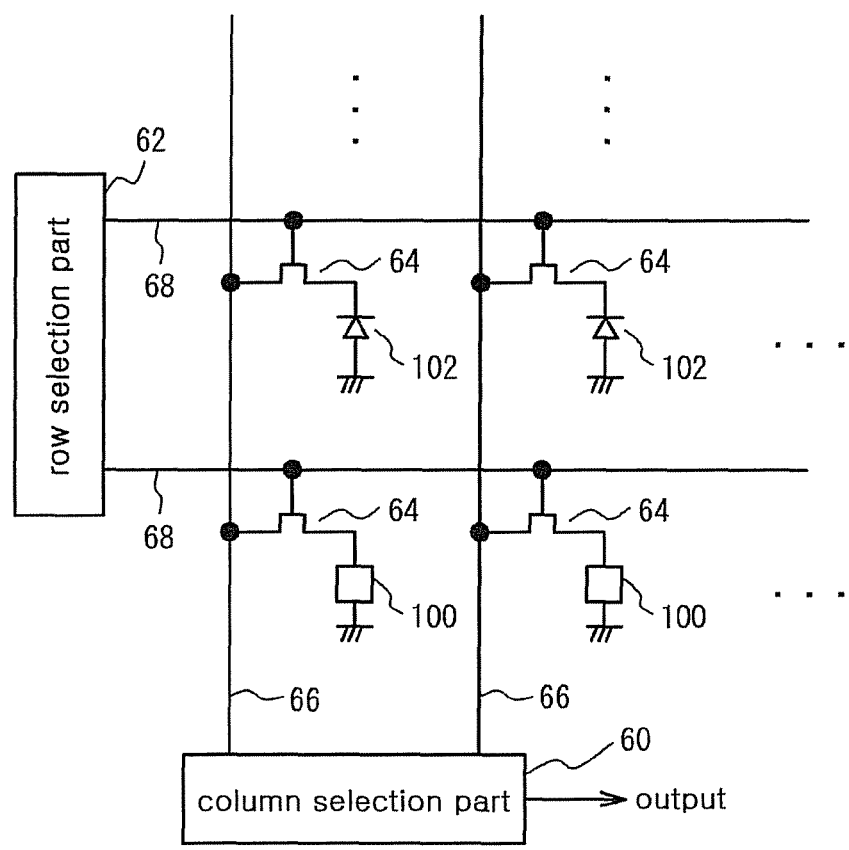
FIG. 11 is a block diagram showing a fourth embodiment.

According to a fourth embodiment, there is provided an image sensor comprising thermoelectric conversion elements 100 and photoelectric conversion elements 102 which are integrated. FIG. 11 is a block diagram showing the fourth embodiment. Here, the thermoelectric conversion elements 100 and the photoelectric conversion elements 102 are arranged in the shape of a matrix. As these thermoelectric conversion elements 100 and photoelectric conversion elements 102, the thermoelectric conversion element 100 and the photoelectric conversion element 102 illustrated according to the first to third embodiments may be used. Each of the thermoelectric conversion elements 100 and the photoelectric conversion elements 102 is disposed between the source and the grand of a selective transistor 64. The gate of the selective transistor 64 is connected to a row selection line 68, and the drain is connected to a column selection line 66. A row selection part 62 and a column selection part 60 select the row selection line 68 and the column selection line 66, thus outputting a signal from predetermined thermoelectric conversion element 100 and photoelectric conversion element 102.

According to the fourth embodiment, as shown in FIG. 11, a plurality of thermoelectric conversion elements 100 and a plurality of photoelectric conversion elements 102 are arranged in the shape of a matrix. The selection part (e.g. the selective transistor 64, the row selection part 62 and the column selection part 60) selects at least one among the pluralities of thermoelectric conversion elements 100 and photoelectric conversion elements 102. Thereby, the signal of the selected one among the pluralities of thermoelectric conversion elements 100 and photoelectric conversion elements 102 may be output.

In the fourth embodiment, a transistor 104 is used as the selective transistor 64, the row selection part 62 and the column selection part 60. Briefly, the selection part includes the transistor 104. Thereby, the thermoelectric conversion elements 100 and the photoelectric conversion elements 102 of the image sensor may be monolithically integrated. Exemplary is an image sensor comprising integrated IR detector and UV detector. Also exemplary is an image sensor comprising integrated far IR detector and near IR detector.

According to the first to third embodiments, the semiconductor layer 38 may include for example AlGaN, GaN, ZnO, MgZnO, AlGaAs, InGaAs, and additionally for example, InP, InAlAs/InP, GaAs, InGaP, InAs, InGaN, SiC, ZnCdO, CdO, MgO, CdO, ZnMgS, ZnS, ZnSe, MgS, MgSe, Si, SiGe and combinations thereof.

The modulation doped structure in the n-type semiconductor layer 20 and the p-type semiconductor layer 30 may include for example, AlGaN/GaN, MgZnO/ZnO and AlGaAs/InGaAs, and additionally for example, InP/InGaAs, InAlAs/InP, InAlAs/InGaAs, AlGaAs/AlGaAs, AlGaAs/GaAs, AlGas/InAs, InGaP/InGaAs, InGaP/AlGaAs, InGaP/GaAs, InGaN/InAs, AlGaN/AlGaN, AlGaN/InGaN, AlInN/InGaN, AlGaN/SiC, GaN/SiC, GaN/InGaN, ZnMgO/ZnCdO, ZnCdO/CdO, MgO/ZnCdO, MgO/ZnO, ZnO/CdO, CdMgO/CdO, ZnMgS/ZnS, ZnS/ZnSe, MgS/MgSe, MgSe/ZnSe, MgS/ZnS, Si, and SiGe.

The substrate 10 may include, depending on the type of the semiconductor layer 38, a Si substrate, and additionally for example a Si substrate having a B-doped Si epitaxial layer formed thereon, a Si substrate having B ions implanted thereto, a Si substrate having an insulating layer of silicon oxide or silicon nitride formed thereon, a GaAs substrate, an InP substrate, a GaN substrate, a SiC substrate, a ZnO substrate, a sapphire substrate, a sapphire substrate having an insulating layer of silicon oxide, silicon nitride or aluminum nitride formed thereon, or a glass substrate.

Although the first to third embodiments describe the absorption of IR rays by means of the absorption part 48, the absorption part 48 may absorb other electromagnetic waves, such as micro waves, etc. The absorption part absorbing the micro waves may be provided with for example an antenna that receives micro waves and a resistor or a diode for converting power of the micro waves received by the antenna into heat.

Although the preferred embodiments of the present invention have been disclosed for illustrative purposes, the present invention is not limited to such specific embodiments, and various modifications and variations are possible, without departing from the scope and spirit of the invention as disclosed in the accompanying claims.

Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. An electronic apparatus, comprising:
a thermoelectric conversion element including a semiconductor layer of stacked heterostructure which performs thermoelectric conversion using Seebeck effect, and
at least one of a photoelectric conversion element in which at least a portion of said semiconductor layer performs photoelectric conversion and a transistor or a diode having at least a portion of the semiconductor layer as an operating layer,
wherein said semiconductor layer has bandgap energy corresponding to UV light,
the thermoelectric conversion element has an IR absorption part which absorbs IR rays and converts them into heat, and
at least the portion of said semiconductor layer of the photoelectric conversion element performs photoelectric conversion of UV light.

2. An electronic apparatus, comprising:
a thermoelectric conversion element including a semiconductor layer of stacked heterostructure which performs thermoelectric conversion using Seebeck effect, and
at least one of a photoelectric conversion element in which at least a portion of said semiconductor layer performs photoelectric conversion and a transistor or a diode having at least a portion of said semiconductor layer as an operating layer,
wherein said semiconductor layer has bandgap energy corresponding to IR rays,
the thermoelectric conversion element has an IR absorption part which absorbs IR rays and converts them into heat, and
at least the portion of said semiconductor layer of the photoelectric conversion element performs photoelectric conversion of IR rays.

3. The electronic apparatus of claim 1, wherein said semiconductor layer includes a p-type semiconductor layer and an n-type semiconductor layer which are stacked with inserted electrical isolation layer, and
the thermoelectric conversion element includes a p-type thermoelectric conversion unit wherein the p-type semiconductor layer performs thermoelectric conversion using Seebeck effect and an n-type thermoelectric conversion unit wherein the n-type semiconductor layer performs thermoelectric conversion using Seebeck effect.

4. An electronic apparatus, comprising:
a thermoelectric conversion element including a semiconductor layer of stacked heterostructure which performs thermoelectric conversion using Seebeck effect, and
at least one of a photoelectric conversion element in which at least a portion of said semiconductor layer performs photoelectric conversion and a transistor or a diode having at least a portion of said semiconductor layer as an operating layer,
wherein said semiconductor layer includes a p-type semiconductor layer and an n-type semiconductor layer which are stacked with inserted electrical isolation layer,
the thermoelectric conversion element includes a p-type thermoelectric conversion unit wherein the p-type semiconductor layer performs thermoelectric conversion using Seebeck effect and an n-type thermoelectric conversion unit wherein the n-type semiconductor layer performs thermoelectric conversion using Seebeck effect, and
the photoelectric conversion element is a photodiode that uses the p-type semiconductor layer and the n-type semiconductor layer.

5. An electronic apparatus, comprising:
a thermoelectric conversion element including a semiconductor layer of stacked heterostructure which performs thermoelectric conversion using Seebeck effect, and
at least one of a photoelectric conversion element in which at least a portion of said semiconductor layer performs photoelectric conversion and a transistor or a diode having at least a portion of said semiconductor layer as an operating layer,
wherein the semiconductor layer includes a p-type semiconductor layer and an n-type semiconductor layer which are stacked with inserted electrical isolation layer,
the thermoelectric conversion element includes a p-type thermoelectric conversion unit wherein the p-type semiconductor layer performs thermoelectric conversion using Seebeck effect and an n-type thermoelectric conversion unit wherein the n-type semiconductor layer performs thermoelectric conversion using Seebeck effect, and
an isolation part is provided between the p-type thermoelectric conversion unit and the n-type thermoelectric conversion unit so as to electrically isolate the p-type semiconductor layer and the n-type semiconductor layer.

6. An electronic apparatus, comprising:
a thermoelectric conversion element including a semiconductor layer of stacked heterostructure which performs thermoelectric conversion using Seebeck effect, and
at least one of a photoelectric conversion element in which at least a portion of said semiconductor layer performs photoelectric conversion and a transistor or a diode having at least a portion of said semiconductor layer as an operating layer, wherein said semiconductor layer includes a p-type semiconductor layer and an n-type semiconductor layer which are stacked with inserted electrical isolation layer, the thermoelectric conversion element includes a p-type thermoelectric conversion unit wherein the p-type semiconductor layer performs thermoelectric conversion using Seebeck effect and an n-type thermoelectric conversion unit wherein the n-type semiconductor layer performs thermoelectric conversion using Seebeck effect, and an ohmic electrode formed on said semiconductor layer disposed at an upper position among the p-type semiconductor layer and the n-type semiconductor layer is a non-alloy ohmic electrode, and an ohmic electrode formed on said semiconductor layer disposed at a lower position among the p-type semiconductor layer and the n-type semiconductor layer is an alloy ohmic electrode.

7. An electronic apparatus, comprising:

a thermoelectric conversion element including a semiconductor layer of stacked heterostructure which performs thermoelectric conversion using Seebeck effect, and at least one of a photoelectric conversion element in which at least a portion of said semiconductor layer performs photoelectric conversion and a transistor or a diode having at least a portion of said semiconductor layer as an operating layer, wherein said semiconductor layer has a modulation doped structure.

8. The electronic apparatus of claim 1, wherein the thermoelectric conversion element and the photoelectric conversion element are provided in plural numbers such that the plurality of thermoelectric conversion elements and the plurality of photoelectric conversion elements are arranged in a matrix shape, and a selection part is provided so as to select at least one among the plurality of thermoelectric conversion elements and the plurality of photoelectric conversion elements and includes the transistor.

9. The electronic apparatus of claim 1, wherein said semiconductor layer includes a p-type semiconductor layer and an n-type semiconductor layer which are stacked with inserted electrical isolation layer, and the thermoelectric conversion element comprises:

a first thermoelectric conversion element including a first n-type thermoelectric conversion unit ($90a$) wherein the n-type semiconductor layer performs thermoelectric conversion using Seebeck effect and a first p-type thermoelectric conversion unit ($92b$ wherein the p-type semiconductor layer performs thermoelectric conversion using Seebeck effect, a second thermoelectric conversion element including a second n-type thermoelectric conversion unit ($92a$) wherein the n-type semiconductor layer performs thermoelectric conversion using Seebeck effect and a second p-type thermoelectric conversion unit ($90b$) wherein the p-type semiconductor layer performs thermoelectric conversion using Seebeck effect, a first beam including the first n-type thermoelectric conversion unit ($90a$) and the second p-type thermoelectric conversion unit ($90b$), a second beam including the first p-type thermoelectric conversion unit ($92b$) and the second n-type thermoelectric conversion unit ($92a$), and a central region to which the first beam and the second beam are connected and which includes a first isolation part for electrically isolating at least one of the p-type semiconductor layer and the n-type semiconductor layer between the first thermoelectric conversion element and the second thermoelectric conversion element, wherein the first thermoelectric conversion element and the second thermoelectric conversion element are connected in a series so that the first n-type thermoelectric conversion unit and the second p-type thermoelectric conversion unit are connected.

10. The electronic apparatus of claim 9, wherein the first beam includes a second isolation part for electrically isolating the first n-type thermoelectric conversion unit and the second p-type thermoelectric conversion unit, and the second beam includes a third isolation part for electrically isolating the first p-type thermoelectric conversion unit and the second n-type thermoelectric conversion unit.

11. The electronic apparatus of claim 2, wherein said semiconductor layer includes a p-type semiconductor layer and an n-type semiconductor layer which are stacked with inserted electrical isolation layer, and the thermoelectric conversion element includes a p-type thermoelectric conversion unit wherein the p-type semiconductor layer performs thermoelectric conversion using Seebeck effect and an n-type thermoelectric conversion unit wherein the n-type semiconductor layer performs thermoelectric conversion using Seebeck effect.

12. The electronic apparatus of claim 2, wherein said semiconductor layer includes a p-type semiconductor layer and an n-type semiconductor layer which are stacked with inserted electrical isolation layer, and the thermoelectric conversion element comprises:

a first thermoelectric conversion element including a first n-type thermoelectric conversion unit ($90a$) wherein the n-type semiconductor layer performs thermoelectric conversion using Seebeck effect and a first p-type thermoelectric conversion unit ($92b$) wherein the p-type semiconductor layer performs thermoelectric conversion using Seebeck effect, a second thermoelectric conversion element including a second n-type thermoelectric conversion unit ($92a$) wherein the n-type semiconductor layer performs thermoelectric conversion using Seebeck effect and a second p-type thermoelectric conversion unit ($90b$) wherein the p-type semiconductor layer performs thermoelectric conversion using Seebeck effect, a first beam including the first n-type thermoelectric conversion unit ($90a$) and the second p-type thermoelectric conversion unit ($90b$), a second beam including the first p-type thermoelectric conversion unit ($92b$) and the second n-type thermoelectric conversion unit ($92a$), and a central region to which the first beam and the second beam are connected and which includes a first isolation part for electrically isolating at least one of the p-type semiconductor layer and the n-type semiconductor layer between the first thermoelectric conversion element and the second thermoelectric conversion element, wherein the first thermoelectric conversion element and the second thermoelectric conversion element are connected in a series so that the first n-type thermoelectric conversion unit and the second p-type thermoelectric conversion unit are connected.

13. The electronic apparatus of claim 12, wherein the first beam includes a second isolation part for electrically isolating the first n-type thermoelectric conversion unit and the second p-type thermoelectric conversion unit, and the second beam includes a third isolation part for electrically isolating the first p-type thermoelectric conversion unit and the second n-type thermoelectric conversion unit.

\* \* \* \* \*